United States Patent [19]
Ameen et al.

[11] Patent Number: 6,143,128
[45] Date of Patent: Nov. 7, 2000

[54] APPARATUS FOR PREPARING AND METALLIZING HIGH ASPECT RATIO SILICON SEMICONDUCTOR DEVICE CONTACTS TO REDUCE THE RESISTIVITY THEREOF

[75] Inventors: Michael S. Ameen, Newburyport, Mass.; Joseph T. Hillman, Scottsdale, Ariz.

[73] Assignee: Tokyo Electron Limited, Tokyo, Japan

[21] Appl. No.: 09/085,217

[22] Filed: May 27, 1998

Related U.S. Application Data

[63] Continuation-in-part of application No. 08/791,954, Jan. 31, 1997.

[51] Int. Cl.[7] ............................................. C23F 1/02
[52] U.S. Cl. ................... 156/345; 118/719; 204/298.01; 134/158
[58] Field of Search .................. 118/723 MP, 723 E, 118/723 ER, 723 I, 723 IR, 719; 156/345; 134/158; 204/298.01

[56] References Cited

U.S. PATENT DOCUMENTS

| | | |
|---|---|---|
| 4,579,609 | 4/1986 | Reif et al. . |
| 4,871,421 | 10/1989 | Ogle et al. . |
| 5,084,125 | 1/1992 | Aoi ......................................... 156/345 |
| 5,342,652 | 8/1994 | Foster et al. . |
| 5,370,739 | 12/1994 | Foster et al. . |
| 5,391,281 | 2/1995 | Hieronymi et al. . |
| 5,434,110 | 7/1995 | Foster et al. . |
| 5,529,657 | 6/1996 | Ishii ....................................... 156/345 |
| 5,556,521 | 9/1996 | Ghanbari . |
| 5,785,796 | 7/1998 | Lee ......................................... 156/345 |
| 5,792,261 | 8/1998 | Hama et al. .......................... 118/723 I |
| 5,897,713 | 3/1999 | Tomioka et al. ...................... 118/723 I |
| 6,003,243 | 7/1998 | Ohmi ....................................... 34/218 |

OTHER PUBLICATIONS

Rana, V.V.S. et al., in: *Tungsten and Other Refractory Metals for VLSI Applications*, vol. II, pp. 187–195, E.K. Broadbent ed., Materials Research Society 1987.
Prasad, Jagdish et al., *Atomic Hydrogen Cleaning of a TiN Surface*, Applied Surface Science 74 (1994), pp. 115–120, 1994 Elsevier Science B.V.
Webster's ninth New Collegiate Dictionary, no date.
Pierson, *Handbook of Chemical Vapor Deposition*, Noyes Publications, Park Ridge, NJ, p. 225, no month.
Taguwa et al., *International Electron Devices Meeting*, Washington, D.C., Dec. 10–13, 1995 pp. 695–698.
Taguwa et al., *IEEE Transactions on Electron Devices*, vol. 44, No. 4, pp. 588–593.

*Primary Examiner*—Richard Bueker
*Assistant Examiner*—Erin Fieler
*Attorney, Agent, or Firm*—Wood, Herron & Evans, L.L.P.

[57] ABSTRACT

A contact cleaning apparatus is equipped with a cleaning gas source, selectively connectable to a gas inlet of the chamber of the apparatus, structure, to supply a gas mixture of hydrogen and argon in which the hydrogen content is between 20 percent and 80 percent by volume. A selectively operable 450 MHz MF energy source is coupled to the chamber to energize a plasma in gas. A selectively operable 13.56 MHz HF energy source, controllable independently of the MF energy source and connected between the substrate support and a chamber anode biases a wafer on the support to less than 100 volts, preferably 15 to 35 volts, negative. A heater heats the wafer to temperature about 550° C. Preferably, a turbo molecular pump is used to pump the cleaning gas while maintaining a pressure of between 1 mTorr and 10 Torr and at a rate of from 3 to 12 sccm.

10 Claims, 2 Drawing Sheets

APPARATUS FOR PREPARING AND METALLIZING HIGH ASPECT RATIO SILICON SEMICONDUCTOR DEVICE CONTACTS TO REDUCE THE RESISTIVITY THEREOF

This application is a continuation-in-part of Michael S. Ameen, and Joseph T. Hillman, U.S. application Ser. No. 08/791,954, filed Jan. 31, 1997 and entitled Method and Apparatus for Preparing and Metallizing High Aspect Ratio Silicon Semiconductor Device Contacts to Reduce the Resistivity Thereof, hereby expressly incorporated herein by reference.

FIELD OF THE INVENTION

The present invention relates to chemical vapor deposition for metallizing high aspect ratio silicon contacts on semiconductor devices being formed on semiconductor wafer substrates, and, more particularly, to apparatus and processes for cleaning and otherwise preparing high aspect ratio contacts and metallizing such contacts, by the chemical vapor deposition thereon of materials such as titanium or titanium nitride, to enhance film formation thereon and reduce the resistivity of the contacts metallized by the process.

BACKGROUND OF THE INVENTION

Silicon contacts form one of the more numerous features on semiconductor devices. The typical configuration of a silicon contact on a semiconductor device is that of a sub-micron width hole or via extending through an insulating layer having a thickness of one micron or more on the device to an exposed area on an electrically conductive underlying layer of silicon that forms the contact. In semiconductor device manufacturing, these silicon contacts are first coated with a thin film of metal or metal compound such as titanium (Ti) or titanium nitride (TiN) that forms the metallization layer over which is applied a conductive metal such as tungsten or aluminum, which fills the hole to form a conductor through the insulating layer. The Ti or TiN film is sometimes applied by a physical vapor deposition process such as sputter coating, although, for high aspect ratio contacts where the high aspect ratio of the hole or via can inhibit the effectiveness of the directional sputter coating process, Ti and TiN films are often applied by chemical vapor deposition (CVD). One such process involves the application of a Ti film by reacting $TiCl_4$ on the wafer surface in the presence of argon and hydrogen plasma to form titanium silicide on the exposed silicon contact surfaces, then, causing a TiN CVD reaction at the surface with the introduction of nitrogen into the chamber coating the titanium silicide with a TiN layer.

A Ti/TiN film forms an effective bond and conductive interface with the silicon contact on which it is applied and also enhances the formation of the overlying blanket or planarization layer that will fill the hole. Where the planarization layer is tungsten, the process currently used for its application is that of CVD with a $WF_6$ reduction by which the tungsten nucleates onto the TiN layer, filling the holes and vias, often by planarizing the surface with a blanket tungsten film. In such a semiconductor manufacturing process, the resistivity of the junction between the Ti/TiN film and the silicon contact at the bottom of the hole or via must be kept low. Oxides and other impurities on the surface of the silicon contact increase the resistivity of the contact, and therefore should be cleaned from the silicon surface at the bottom of the hole, particularly where the size of the contact is small.

Research has focused attention on methods of cleaning silicon contacts in these high aspect ratio semiconductor devices. Wet chemical techniques such as the multi-step processes and hydrofluoric acid dip processes are used as the current industry standard, but when the holes have dimensions of one-quarter micron or less, these wet cleaning methods often contribute particles that can contaminate the wafer as well as being less than fully effective in cleaning the contact surfaces at the bottoms of these deep narrow holes and vias.

In situ methods of cleaning silicon contacts, that is methods where wafers containing the devices are cleaned in place in the processing machine in which the metallization is to occur, just prior to metal deposition, have been of extreme interest in that they can provide a particle free environment and reduce native oxide formation on the silicon contacts during transfer through atmosphere and into the deposition module. In situ approaches of the prior art have, however, not been effective. One in situ method of cleaning the surfaces at both the contact and via level has included a physical etching process using an inert gas such as Argon in a plasma. Such plasmas are typically created by oppositely biasing electrodes to move electrons through the gas, stripping gas atoms of their electrons to create a plasma of positive Argon ions. One of the electrodes is typically a cathode assembly on which the surface to be cleaned is mounted. The positive Argon ions that are created in the plasma are accelerated to the surface of the wafer by a negative bias applied to the wafer surface, where the ions strike the surface and thereby dislodge material from the wafer surface by momentum transfer to remove the material from the wafer. Plasmas are usually confined close to the surface to be plasma etched by the configuration of the chamber walls and other physical structure within the chamber or by magnetic fields that trap the plasma producing electrons over the surface to be etched.

Physical processes such as plasma etching produce bombardment induced damage to the surface of the wafer and to devices being formed on the wafer. In the past, maintaining a low sputtering voltage difference between the substrate and a dense plasma, a process called "soft etch", has been sufficient to minimize some of the potential damage to the surface being etched, but with present devices having features on a sub-micron scale, these soft etch voltages can still impart enough energy to the ions to cause them to inflict damage to some of the devices on the wafers. One such soft etch process uses a plasma cleaning method in which the plasma is powered independent of the accelerating bias voltage, which provides separate control of the bias voltage to allow lower sputtering energy to be used while still maintaining a plasma that is adequately dense for the process to proceed efficiently where the features are not too small. Nonetheless, such low energy sputter cleaning processes still have several drawbacks for very high aspect ratio devices currently being manufactured. Physical processes such as sputtering can redeposit materials from sidewalls of such high aspect ratio holes and vias onto the contact areas at the bottoms. Further, sputtering yields on the contacts at the bottoms of the deep holes and vias are low, which makes the cleaning process inadequate or at least very slow.

The need to clean a semiconductor wafer surface while inflicting minimal damage from the energy of the sputtering ions has been approached with the use of high density low energy plasmas such as those produced by electron cyclotron residence (ECR). ECR plasma sources, however, include microwave generators and other complex components that are expensive and occupy substantial space either at the cleaning site or at a somewhat remote location near the cleaning site. These ECR generators produce a high density plasma that is caused to flow downstream and against the surface of the wafer to be cleaned. Such plasmas are capable of contacting the surface of the wafer biased at a low voltage so that ions strike the wafer surface with energy sufficiently low to reduce surface damage. However, low sputtering yield and therefore difficulty in effectively cleaning contacts at the bottoms of vias has remained a deficiency of purely physical etching processes.

The low sputtering yield in particular has led to investigation of adding a diffusive, chemical component to the etch, such as a component of hydrogen radicals to provide a hydrogen-based silicon contact cleaning process. Hydrogen based cleaning using ECR plasma sources has demonstrated successful cleaning of silicon contacts using an argon/$H_2$ plasma prior to CVD-Ti deposition. But remotely located ECR sources suffer nonetheless from large size and complex and expensive equipment as discussed above.

Accordingly, there remains a need for a method and an apparatus for effectively cleaning high aspect ratio contacts, without damage to the devices, that provide benefits at least as good as those of an ECR source, but with much simpler equipment, and that preferably can be carried out in the same apparatus or chamber in which a subsequent metallization coating is to be applied.

SUMMARY OF THE INVENTION

A primary objective of the present invention is to provide a CVD metallization process that includes a method of cleaning high aspect ratio silicon contacts that solves the problems of the prior art, particularly as set forth above.

An objective of the present invention is to provide a method and apparatus for cleaning contacts at the bottoms of high aspect ratio features on semiconductor wafers without damage to the devices which the wafers contain. It is a particular objective of the present invention to provide a CVD metallization method and apparatus, particularly for application of a titanium and/or titanium nitride metallization layer, that includes such contact precleaning in the CVD apparatus, either in a separate processing chamber in the vacuum of the same tool as that in which the subsequent coating is to be applied or in situ in the CVD processing chamber in which the subsequent coating is to be applied.

It is a particular objective of the present invention to provide a method and an apparatus, which provide for the cleaning of contacts in high aspect ratio features of semiconductor wafers, that can accomplish the cleaning in close proximity to the site at which, and in the environment where, the subsequent coating is to be applied.

It is a further objective of the present invention to provide a method and apparatus for cleaning the contacts in high aspect ratio features with equipment that is simple and neither complex nor expensive, and to provide a method and an apparatus to effectively clean high aspect ratio contacts on semiconductor wafers without damage to the devices on such wafers while providing benefits of more expensive and larger ECR plasma sources but in simple equipment.

According to principles of the present invention, there is provided a method of cleaning high aspect ratio contacts prior to metallization, particularly metallization with Ti or TiN by CVD, wherein a plasma is formed by coupled RF energy, preferably medium frequency RF energy of, for example, about 450 kHz. Preferably also, the apparatus includes a second and high frequency energy source of, for example, 13.56 MHZ connected between the wafer support and the chamber ground. The wafer is biased by the HF source preferably independently of the power from the coupled MF source that is sustaining the plasma. Such bias is preferably less than 100 volts.

The method according to one embodiment of the present invention uses a dual frequency plasma generator such as is described in U.S. Pat. No. 5,391,281, assigned to the assignee of the present application and hereby expressly incorporated by reference herein. The shape of the chamber is preferably cylindrical and contains a wafer support or platen. CVD apparatus is preferably of the type disclosed in U.S. Pat. No. 5,370,729 assigned to the assignee of the present application and hereby expressly incorporated by reference herein. Such cleaning structure is particularly suitable where provided as a separate chamber in which cleaning by an inductively coupled plasma (ICP) is employed and from which the cleaned substrate is transferred under vacuum into the chamber in which the subsequent coating is to be applied, preferably through a transfer chamber of the same tool.

In accordance with an alternative embodiment of the invention, the process and equipment for pre-cleaning silicon contacts, in connection with the their metallization by CVD of Ti/TiN, uses a soft etch equipped module having a turbo molecular pump for pumping hydrogen at high speed, while the chamber wall has no protrusion for displacing the plasma as in plasma generator described in U.S. Pat. No. 5,391,281, thereby increasing the total plasma volume above the wafer and increasing the efficiency of hydrogen radical formation. Preferably further, the system is configured to deliver hydrogen gas at between 3 and 12 sccm (standard cubic centimeters per minute), preferably in addition to Argon, in the MF RF energized plasma. The addition of hydrogen gas produces hydrogen radicals in the plasma volume above the wafer through direct electron excitation and collisional processes. The radicals diffuse downstream and onto the surface of the heated wafer to clean the silicon surface of the wafer. The chemical or reactive nature of the cleaning process with the hydrogen present in the gas facilitates a diffuse cleaning operation in the holes and vias that overcome disadvantages of highly directional physical sputtering. Preferably, such a soft etch module is a module of a cluster tool connected to a transfer module through which the substrate can be transferred under vacuum into a CVD or other coating module also connected to the transfer module of the tool.

With the hydrogen containing plasma, argon content is preferably maintained at a level that is at least high enough, and preferably at least 10 to 20 percent by volume of the total gas flow, to aid in maintaining ignition of the plasma in the hydrogen containing gas. Otherwise, the argon content should be as low as possible. Preferably, the wafer is supported on a heated platen which maintains it at a temperature of at least 400° C., and preferably of about 550° C. The wafer may also be biased to utilize some physical sputtering in the cleaning. Pressure during the cleaning steps is preferably maintained in the 1 mTorr to 10 Torr range. It has been found that utilizing a gas mixture of much less than 20 percent hydrogen does not sufficiently reduce the undesirable effects of physical etching with argon, while utilizing much less than 20 percent argon does not maintain the hydrogen plasma. Within the range of 20 to 80 percent hydrogen, a minimum argon content can be selected, which varies with the parameters of various devices, that sustains a plasma in the hydrogen. For different applications and processing chamber structure, the ideal composition of gas will vary, but the ideal composition can be empirically selected that produces a maximum etch rate due to hydrogen with a minimum contribution to the etching being from argon.

The present invention has the advantage of altering the silicon surface by exposure to activated hydrogen ambient such that hydrogen radicals act to reduce $SiO_2$ through the formation of OH species. Hydrogen also removes surface carbon by formation of CH species. This hydrogen has also been found to passivate the silicon surface, leaving a Si—H bond which acts to prevent oxidation or surface reconstruction prior to metal deposition. This allows the subsequent metallization, particularly with Ti or TiN metallization to form very good junction characteristics due to the cleaner and more stable silicon surface.

Further, the present invention provides a method by which different etch rates can be achieved by controlling various parameters of the soft etch process, such as the parameters of wafer temperature, hydrogen-argon ratio, bias voltage and RF plasma power. The presence of hydrogen to the plasma results in a reduced contribution to the overall etch rate due to the physical etching by argon, resulting in effective cleaning by a lower energy etch, thereby subjecting the devices on the wafer to a lower likelihood of damage.

In the preferred and illustrated embodiments of the present invention, the advantages are provided by coupling two RF frequencies of energy, one of medium frequency RF coupled into the chamber and one of HF connected to energize the substrate with a low voltage independently controlled bias, producing a plasma upstream of the surface to be cleaned. The chamber is preferably provided with gas flow structure so that the plasma is produced in an unobstructed open space a distance from the surface to be cleaned as the gas flows downstream against and across the surface. The gas contains a mixture of inert gas, such as argon, and hydrogen and is introduced into the chamber and maintained there at a vacuum by a turbo molecular pump. The surface to be cleaned is separately biased to a small degree, for example at −15 to −35 volts, and is preferably heated during cleaning, for example up to approximately 550° C. A separate CVD apparatus is equipped with the features that can be used for controlling the gas flow and temperature during stages of the invention will be readily apparent from the following detailed description of the steps of the preferred method and the detailed description of the drawings.

DETAILED DESCRIPTION OF THE DRAWINGS

Figures 1, 2:
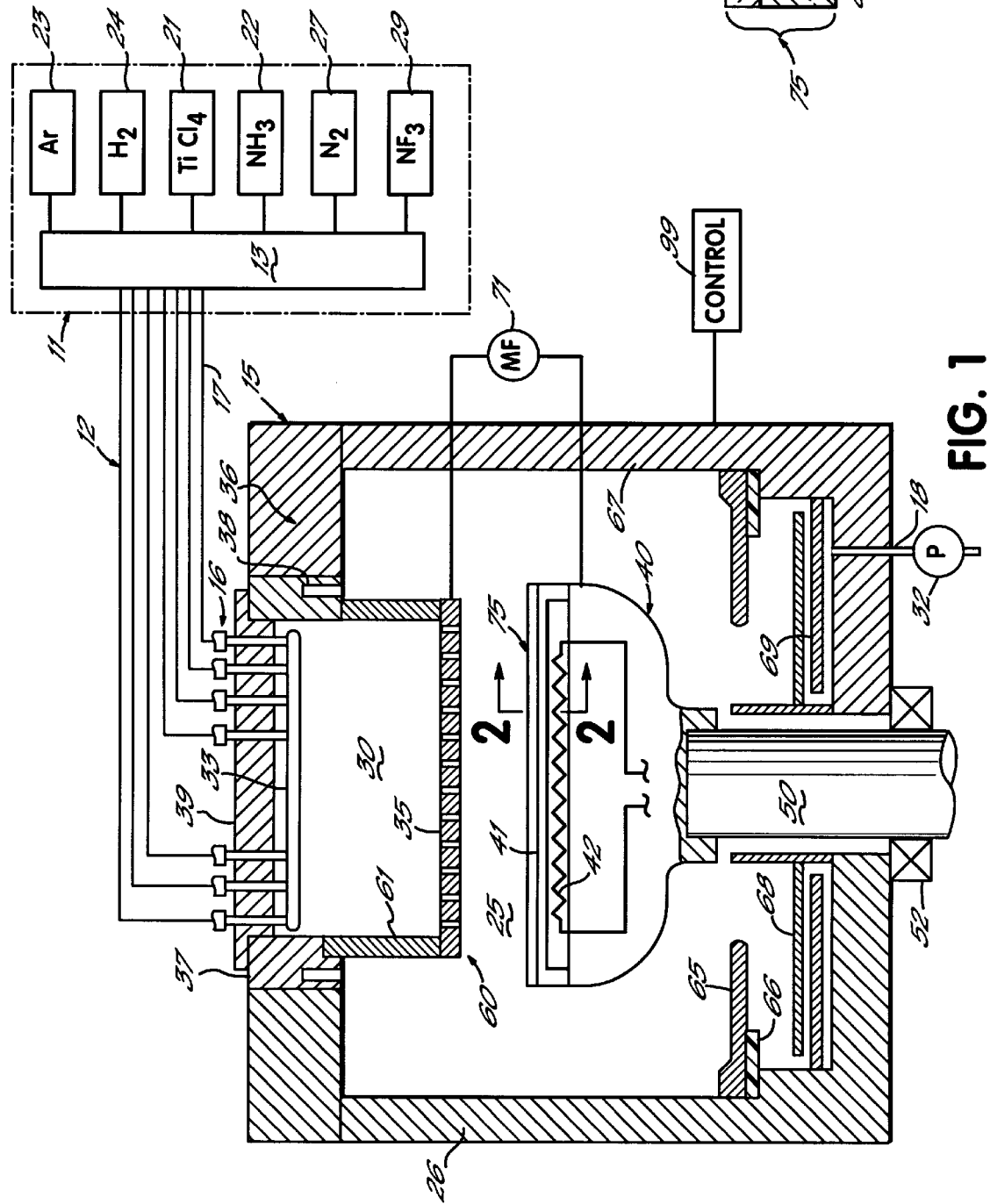
FIG. 1 is a diagrammatic illustration of a CVD apparatus that maybe used in a cluster tool or that itself includes high aspect ratio contact cleaning features according to one embodiment of the invention in which the cleaning capability is provided in situ. In the CVD with parallel plate plasma generation.
FIG. 2 is an enlarged view of a portion of FIG. 1 illustrating the cross-section of the wafer having high aspect ratio contacts.

FIG. 1 illustrates a CVD reactor 15 of apparatus 10a (FIG. 3) in which is embodied high aspect ratio contact cleaning features of the present invention. The reactor 15 includes a gas supply 11 that contains tanks and flow controllers with connections for inlet lines 12 for supplying gases to chemical vapor deposition (CVD) reactor 15. The supply 11 includes, in the illustrated embodiment, tanks 21 and 22 of reactant gases such as titanium tetrachloride ($TiCl_4$) and ammonia ($NH_3$), which are capable of producing a chemical reaction in a CVD process for the deposition of titanium (Ti) or titanium nitride (TiN). The supply 11 also includes a tank 23 of the inert gas argon (Ar) and a tank 24 of hydrogen gas ($H_2$), which maybe used to carry out the cleaning process provided by one embodiment of the present invention. The tanks 21–24 connect through lines 12 through selectably controllable valves 13 to gas inlet ports 16 in a sealed housing wall 26 that encloses a processing chamber 25 within the reactor 15. In addition to the gases supplied from the tanks 21–24, the supply 11 may also be equipped with connections to tanks of additional reactant gases, such as tanks of nitrogen ($N_2$) 27, of hydrogen ($H_2$) 24, and of silane ($SiH_4$) 28 (not shown), also selectively connectable through respective ones of the valves 13 and lines 12 to ports 16 in the reactor wall 26. A gas source may also be connected to an inlet port 17 for the cleaning of the chamber, such as source 29 of nitrogen trifluoride ($NF_3$) gas, which is effective for the plasma cleaning of a chamber of deposit buildups following its use in deposition of tungsten. The reactor may be one that is also useful for the deposition of many other films that can be applied through a CVD process and for other processes used in the production and processing of semiconductor wafers.

The reactor 15 also includes an exhaust port 18 in the bottom of the housing wall 26 to which is connected one or more vacuum pumps for evacuating the chamber 25 of the reactor 15 for maintaining a vacuum within the reactor 15 at the required operating pressure levels, and for exhausting unused reactant gas, reaction byproducts, cleaning gases and inert gases from the reactor. For pumping gas that includes a high percentage of hydrogen during performance of the cleaning process of the present invention, a turbo molecular pump 32 is provided.

The turbo molecular pump 32 is capable of producing a flow rate of hydrogen at from 1 to 20 sccm at pressures over a range that at least includes from 0.1 to 10 Torr.

The housing or reactor wall 26 is preferably made of a non-magnetic material such as aluminum and may be provided with independent temperature control, both for heating and cooling of the reactor wall, to produce what is sometimes generically referred to as a warm wall reactor. The housing 26 has, at the top thereof, a chamber cover 36, preferably also of aluminum, which encloses the reaction chamber 25. The cover 36 is pneumatically sealed against the top of the housing 26. An inlet gas mixing chamber 30 mounted on the inside of the cover 36 having an annular mixing chamber wall 37, which is capable of being actively cooled, where the process, for example a tungsten deposition process, so requires, by cooling fluid supplied to flow through an annular passage 38 formed in the wall 37 to maintain it at a temperature lower than the reaction temperature that is independent of that of the housing 26 and that of the chamber cover 36. Like the housing 26, the mixing chamber wall 37 is also provided with resistance heating elements (not shown) to heat the wall and the mixing chamber 30 where the process so requires, such as for titanium nitride deposition. This annular wall 37 may be made of a thermally nonconductive material or of a conductive material thermally insulated from the aluminum material of the processing chamber cover 36 to provide greater flexibility in the control of its temperature. The upper portion of the mixing chamber 30 is closed by a removable cover or top plate 39, preferably of stainless steel, which is sealably connected to the processing chamber cover 36, and through which the inlet ports 16 are mounted. The chamber housing 26, chamber cover 36 and top plate 39 form a sealed vessel enclosing an internal volume that is maintained at a vacuum pressure level during operation of the reactor 15.

The bottom of the gas mixing chamber 30 is closed by a circular showerhead 35 connected to the bottom of the mixing chamber wall 37. The showerhead 35 may be made of aluminum having a pattern of holes therein and having a highly polished lower surface to retard the absorption of radiant heat from the higher reaction temperature from the area of a wafer being processed within the chamber 25. The showerhead 35 may alternatively be formed of a porous metal plate. A wafer support or susceptor 40 is provided within the chamber 25, preferably directly beneath the showerhead 35 and in axial alignment therewith. The susceptor 40 has an upwardly facing circular wafer supporting surface 41 thereon and includes a heater 42 for raising the temperature of a wafer on the surface 41 to a reaction or processing temperature. The heater 42 is preferably a resistance heating type that is energized by an electrical source (not shown) and is capable of elevating the temperature of a wafer on the surface 41 to at least 800° C.

The gas mixing chamber 30 is provided with a plurality of concentric hollow tubular rings 33, preferably one connected to each of the inlet ports 16, each of the rings 33 having a plurality of holes spaced along them and around the centerline or axis of the chamber 25 that aligns with the axis of the susceptor 40.

The chamber 25 is preferably provided with a plasma electrode 60, preferably formed by fabricating the showerhead 35 out of a conductive material such as nickel or another metal like Aluminum, mounted on a cylindrical quartz insulator 61 secured to the chamber cover 36. This electrode is energized by radio frequency electric energy from an RF source to generate a plasma. The electrode 60 is used to energize the $NF_3$ for plasma cleaning of the chamber. For plasma cleaning, RF energy is connected between the electrode 60 and the grounded susceptor 40. Two baffles 68 and 69 are provided between an electrode 65 and the bottom of the housing 26.

The electrode 60 is energized by an RF generator 71 that is connected between the electrode 60 and the susceptor 40, forming a parallel plate plasma generator to process the wafer 75 in accordance with one embodiment of the present invention. The generator may apply MF energy, for example, at 450 kHz to produce a plasma adjacent the wafer 75.

The reactor 15, equipped as described above, operates to perform the process of the present invention by effectively cleaning high aspect ratio contacts on semiconductor wafers, such as the wafer 75, a closeup of which is illustrated in FIG. 2. In FIG. 2, wafer 75 includes a base or substrate layer 76 of silicon (Si) over which has been deposited a generally insulating layer, such as, for example, layer 77 of silicon dioxide ($SiO_2$) having a thickness of, for example, one micron. Through the insulating $SiO_2$ layer 77 has been formed, by etching or some other process, a number of holes 78 or vias that pass through the layer 77 to expose the conductive silicon layer 76 underneath. The exposed area at the bottom of the hole 78 constitutes a contact 80 to which must be connected an electrical conductor by a process referred to as "metallization". In a metallization process, a thin layer 81 of Ti or TiN is typically deposited onto the contacts 80 over which a blanket layer 82 of a conductive metal such as tungsten is deposited to fill the holes 78 to form a contact that extends through the $SiO_2$ layer 77. The Ti and TiN layers enhance the bond and electrical conductivity between the tungsten and the silicon layer 76.

The process of forming the $SiO_2$ layer and pattern of holes 78 is typically carried out in one or more processing machines from which they are transported through an oxygen containing environment to the CVD reactor 15 for further processing. During this transportation of the partially processed wafers 75, oxides tend to form on the contacts 80, which can inhibit the effective deposition of Ti or TiN onto the Si of the contact 80 and can increase the resistivity at the contact. By the process of the present invention, the contact 80 is cleaned by a $H_2$ plasma etch after being introduced into a vacuum atmosphere for the deposition of the Ti or TiN layer by CVD, and preferably in the same chamber 25 in which the Ti or TiN layer is to be deposited.

According to the embodiment of the process of the present invention described in parent U.S. Pat. No. 5,834, 371 referred to above, a wafer 75 having a substrate base layer of Si thereon and covered with an insulating layer 77, such as an $SiO_2$, overlying the Si layer 76 with a pattern of holes 80 therethrough, is placed on susceptor 40 in the chamber 25 of the CVD reactor 15 of the apparatus 10. The chamber 25 is then purged by flushing it with argon gas from Ar source 23 and by pumping the chamber 25 to a vacuum of about $10^{-4}$ Torr. When the chamber 25 is purged of unwanted gas, a mixture of $H_2$ and Ar gases, from the sources thereof 24 and 23, are entered into the mixing chamber 30 and from there through the showerhead 35 and into the chamber 25. This gas mixture is caused to flow toward and then radially away from the center of the wafer 75 mounted on the susceptor 40, and then around the lower electrode 65 and baffles 68 and 69 and through the exhaust port 18. The flow rate is preferably in the range of 3 to 12 sccm of $H_2$, with the $H_2$ being between 20 and 80 percent of the mixture. The heater 42 is energized to raise the temperature of the wafer 75 to at least 400° C., and preferably to about 550° C.

When the flow of the $H_2$ and Ar gas mixture has been established, the generator 71 is activated to energize a plasma in the gas mixture between the showerhead 35 and the surface of the wafer 75 supported on the top of the susceptor 40. The mixture of $H_2$ in the mixture is preferably kept as close to 80% as can be maintained provided that the plasma in the mixture will ignite. The energy from the generator 71 is typically at 450 kHz in the MF band. The susceptor 40 does not need to be rotated during this cleaning process. The conditions of the process are maintained for approximately 60 seconds. The wafer 75 is biased, by energization of an HF generator (not shown), which operates at typically 13.56 MHZ, to a negative voltage that has a magnitude of less than 100 volts, and preferably less than 50 volts. Preferably, the bias voltage is maintained at a negative voltage of between 15 and 35 volts. During the process, a hydrogen rich plasma is formed and caused to flow across the surface of the wafer 75, with hydrogen ions being produced and attracted to the surface of the wafer 75, which is biased to attract and slightly accelerate the hydrogen ions to it. These ions clean the oxides from the contacts and form hydrogen-hydrogen bonds on the surface of the contacts 80.

Following the cleaning steps of the process recited above, and before exposure of the wafer 75 to atmosphere, a Ti or TiN CVD process is performed to deposit a film onto the cleaned contacts. In the preferred embodiment of the invention, the Ti or TiN CVD process is carried out in the chamber 25. In the performance of a Ti coating process, TiCl₄ is caused to flow from the source 21 into the mixing chamber 30 through the valves 13, lines 12 and inlets 16 along with Ar and H₂, from sources 23 and 24, and from the mixing chamber 30 into the chamber 25 and across the surface of the wafer 75. Upon contact with the heated wafer 75 in chamber 25, the hydrogen reduces the TiCl₄ to produce Ti on the substrate surface that has been plasma cleaned according to principles of the present invention. For a TiN coating process, which is preferably performed after a Ti forming process, NH₃ is caused to flow from source 22 to the surface of the heated wafer 75, reducing further TiCl₄ and forming a TiN layer on the wafer surface. For Ti and TiN coating processes, the wafer 75 is heated to a reaction temperature sufficient to maintain a CVD reaction to deposit the desired Ti or TiN film, which reaction temperature is typically in the range of from 450° C. to 650° C. The CVD process is carried out at a pressure of about 10 Torr and a flow rate of about 2000 sccm of total reactant gas for a time of about one minute.

Following the deposition of the Ti or TiN layer, a tungsten layer is typically applied. This may be carried out in the chamber 25, but will usually be more conveniently carried out in a similar chamber of a similar reactor that is connected to the same vacuum environment of the apparatus 10 as is the reactor 15. Such a tungsten deposition process is carried out, preferably, in accordance with the processes set forth in U.S. Pat. Nos. 5,434,110 and 5,342,652, expressly incorporated herein by reference.

Figure 3:
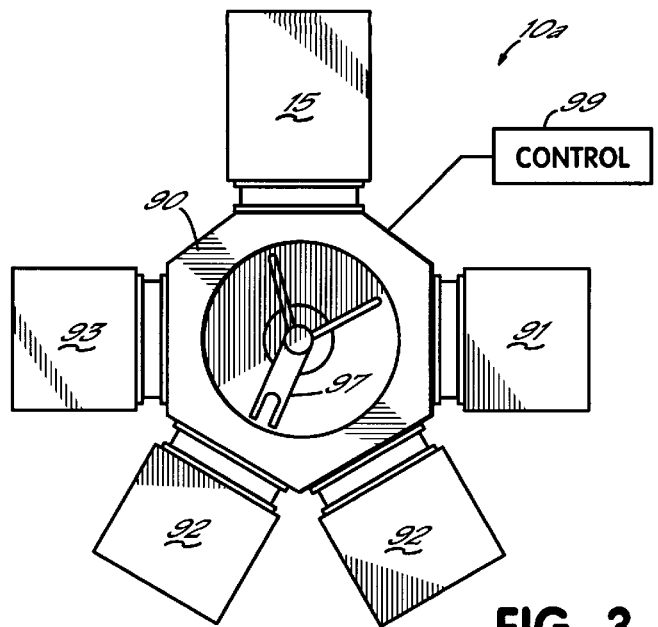
FIG. 3 is a diagrammatic plan view of a cluster tool according to an alternative embodiment of the present invention and including the CVD apparatus of FIG. 1 in which cleaning is provided in a separate module from the coating module.

FIG. 3 illustrates the configuration of an apparatus 10a in which the CVD coating process is provided in a CVD reactor 15 is connected to a transfer module 90 to which is also connected a soft-etch or cleaning module 91, one or more load-lock modules 92 and other processing modules 93. Gas supply 11 provides reactant gasses to the reactor 15. In addition, gas supply 11a is connected to the cleaning or soft etch module 91 to provide hydrogen (H₂) and argon (Ar) gas to the module 91. The cleaning portion of the process described above is performed in the module 91 while the CVD coating portion of the process described above is performed in the CVD reactor 15. Following hydrogen and argon plasma cleaning in module 91, the substrate is transferred under vacuum by a transfer arm 97 in the transfer module 90 through the transfer module 90 and into the CVD reactor 15 for coating, preferably according to the coating process described above.

Figure 4:
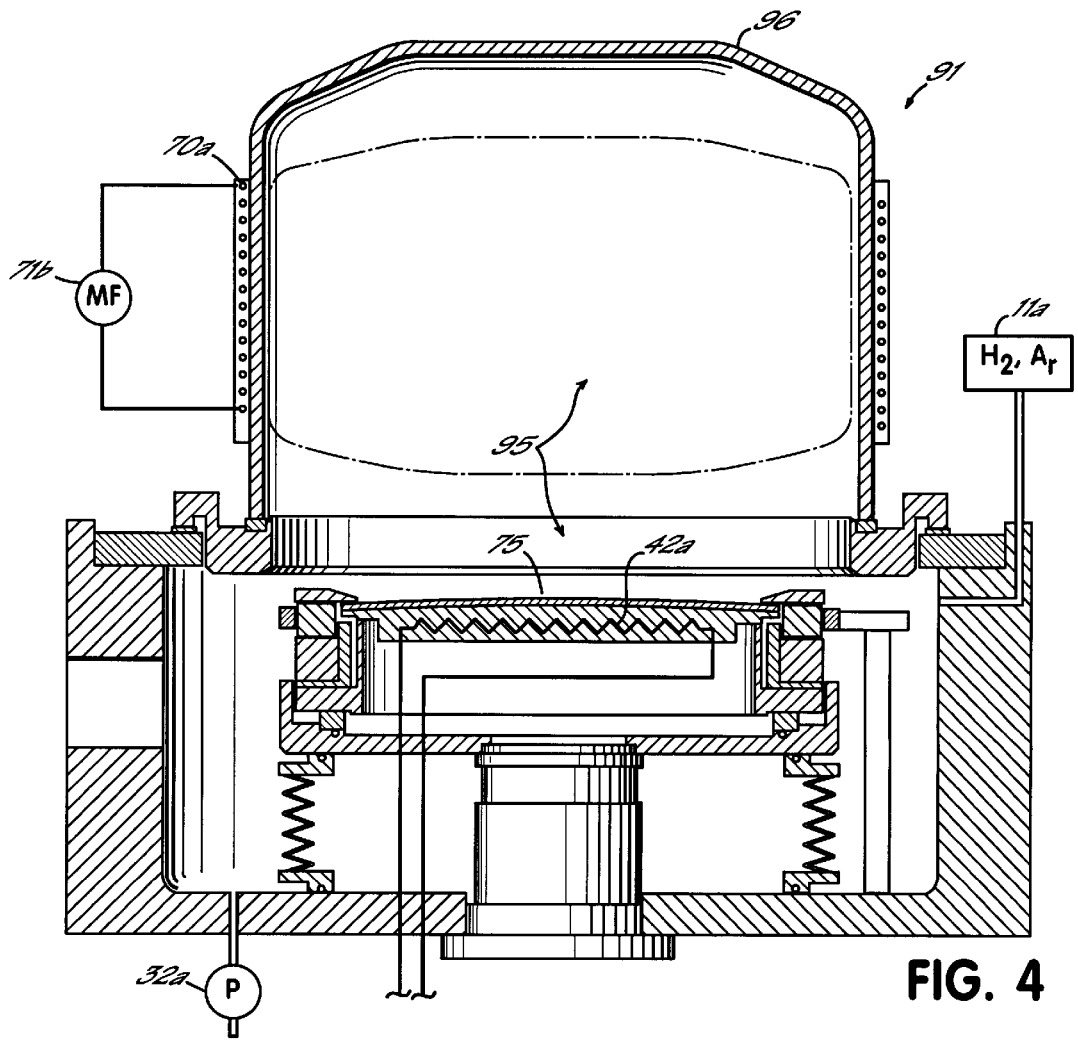
FIG. 4 is a cross-sectional diagram of one embodiment of a cleaning module of the alternative apparatus of FIG. 3.

As illustrated in FIG. 4, the cleaning module 91 has a gas supply 11a to supply the hydrogen and argon gas mixture. A turbo molecular pump 32a is connected to the cleaning module 91 to produce a flow rate of hydrogen at from 1 to 20 sccm at pressures over a range that at least includes from 0.1 to 10 Torr. The method according to one embodiment of the present invention uses a dual frequency plasma generator (not shown) such as is described in U.S. Pat. No. 5,391,281, which is incorporated by reference herein. The shape of the chamber as of cleaning module 91 is rather preferably cylindrical and contains a wafer support or platen 94 on which the substrate 75 is placed for cleaning. Heater 42a is provided in the support 94 to heat the wafer 75 to at least 400° C., and preferably to 550° C. for cleaning. A quartz belljar forms the upper wall 96 of the chamber 95 around the circumference thereof and helical coil 70a is provided around the belljar outside the chamber 95 of the module 91 to which is conducted medium frequency RF source 71b, which is similar to the generator 71 descibed in connection with FIG. 1 above. The MF energy from the generator 71b that is coupled from coil 70a into the chamber 95 to performs the cleaning portion of the process described above. A machine control 99 is provided for the apparatus 10a or CVD reactor 15 the individual control functions of which are conventional but the overall process control being programmed to clean and coat the wafer 75 in accordance with the processes described above.

From the description of the preferred embodiments of the process and apparatus of the present invention set forth above, it will be apparent to one of ordinary skill in the art that variations and additions to the embodiments disclosed can be made without departing from the principles of the present invention.

Therefore, what is claimed is:

1. A CVD apparatus comprising:

a vacuum transfer module having a transfer mechanism therein;

a CVD vacuum processing chamber having a gate connected to the transfer module;

gas inlet structure positioned in the processing chamber and oriented to direct a flow of gas against a substrate on a support;

a reactant gas source of a compound of titanium, selectively connectable to the gas inlet structure;

a titanium containing reactant gas in the CVD vacuum processing chamber capable of producing a CVD reaction for depositing on the substrate a film consisting essentially of titanium or titanium nitride;

a cleaning module having a vacuum cleaning chamber therein, a substrate support in the cleaning chamber and a gate connected to the transfer module;

gas flow ports in the cleaning module;

a cleaning gas source of hydrogen and argon, selectively connectable to the gas flow ports;

a gas mixture of hydrogen and argon in the cleaning chamber, the hydrogen comprising between 20 percent and 80 percent by volume:

a coil surrounding the cleaning chamber;

an RF energy source connected to the coil for inductive coupling into the cleaning chamber through the coil to produce an inductively coupled plasma in the hydrogen and argon gas mixture in the chamber;

a heater positioned to heat a substrate on the support in the cleaning chamber during cleaning thereof to a temperature of at least 400° C.; and control means for operating the apparatus to place, with the transfer arm, a substrate into the cleaning chamber and onto the support therein, regulating a flow of argon and hydrogen from the gas source to the cleaning chamber to supply the hydrogen and argon gas mixture with 20 to 80 percent by volume hydrogen, activating the heater to heat the substrate on the support in the cleaning chamber, energizing a plasma in the hydrogen and argon gas mixture and cleaning contacts on the heated substrate in the cleaning chamber therewith, transferring the cleaned substrate from the cleaning chamber under vacuum into the CVD processing chamber, and producing a CVD reaction in the CVD processing chamber to deposit on the substrate a film consisting essentially of titanium or titanium nitride.

2. The apparatus of claim 1 further comprising:

a turbo molecular pump connected to gas flow ports of the cleaning chamber and operable to cause the flow of cleaning gas from the cleaning gas source, through the gas flow ports into the chamber, downstream from the flow ports to the substrate support and from the substrate support out of the chamber through the pump.

3. The apparatus of claim 1 further comprising:
a pump connected to the gas flow ports of the cleaning chamber and operable to cause the flow of cleaning gas from the cleaning gas source, through the gas flow ports into the chamber, downstream to the substrate support from the gas flow ports, and from the substrate support out of the chamber through the pump while maintaining a pressure of between 1 mTorr and 10 Torr within the cleaning chamber.

4. The apparatus of claim 1 her comprising:
a pump connected to the cleaning chamber and operable to cause the flow of cleaning gas from the cleaning gas source and through the gas flow ports into the chamber, downstream from the gas flow ports and across the substrate support at a rate of from 3 to 12 sccm, and from the substrate support and out of the cleaning chamber through the pump.

5. The apparatus of claim 1 wherein:
the RF energy of the RF energy source has a medium frequency of approximately 450 kHz.

6. The apparatus of claim 1 further comprising:
a selectively operable HF energy source, controllable independently of the RF energy source, connected to the substrate support in the cleaning chamber, and configured to bias a substrate on the support to a voltage having a magnitude of less than 100 volts;
the HF energy of the HF energy source producing RF energy having a frequency of approximately 13.56 MHZ.

7. The apparatus of claim 1 further comprising:
a selectively operable HF energy source, controllable independently of the RF energy source, connected to the substrate support in the cleaning chamber, and configured to bias a substrate on the support to a voltage having a magnitude of about 100 volts.

8. The apparatus of claim 1 further comprising:
a selectively operable HF energy source, controllable independently of the RF energy source, connected to the substrate support in the cleaning chamber, and configured to bias a substrate on the support.

9. The apparatus of claim 1 wherein:
the heater is controlled by the control means to heat the substrate during cleaning thereof to a temperature that is between 400° C. and 800° C.

10. The apparatus of claim 1 wherein:
the heater is operable to heat the substrate during cleaning thereof to a temperature of about 550° C.

* * * * *

UNITED STATES PATENT AND TRADEMARK OFFICE
CERTIFICATE OF CORRECTION

PATENT NO.   : 6,143,128
DATED        : November 7, 2000
INVENTOR(S)  : Ameen et al.

It is certified that error appears in the above-identified patent and that said Letters Patent is hereby corrected as shown below:

Column 5,
Line 49, reads "maybe" and should read -- may be --.
Line 52, reads "in situ. In the CVD" and should read -- in situ in the CVD --.

Column 6,
Line 11, reads "maybe" and should read -- may be --.

Column 9,
Line 32, reads "in a CVD reactor 15 is connected" and should read -- in a CVD reactor 15 connected --.
Line 56, reads "The shape of the chamber as of cleaning" and should read -- The shape of the chamber 95 of cleaning --.

Column 10,
Line 1, reads "95 to performs" and should read -- 95 performs --.
Line 39, reads "80 percent by volume:" and should read -- 80 percent by volume; --.

Column 11,
Line 13, reads "claim 1 her comprising" and should read -- claim 1 further comprising --.

Signed and Sealed this

Sixteenth Day of October, 2001

*Attest:*

*Nicholas P. Godici*

NICHOLAS P. GODICI
*Attesting Officer*   *Acting Director of the United States Patent and Trademark Office*